(12) United States Patent
Mo

(10) Patent No.: US 10,294,012 B2
(45) Date of Patent: May 21, 2019

(54) FLUID DISPENSER

(71) Applicant: SAMSUNG ELECTRONICS CO., LTD., Suwon-si, Gyeonggi-do (KR)

(72) Inventor: Beoung-Hun Mo, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 23 days.

(21) Appl. No.: 15/490,153

(22) Filed: Apr. 18, 2017

(65) Prior Publication Data

US 2018/0111747 A1    Apr. 26, 2018

(30) Foreign Application Priority Data

Oct. 24, 2016  (KR) .................. 10-2016-0138644

(51) Int. Cl.
| | |
|---|---|
| *B65D 83/14* | (2006.01) |
| *B65D 41/62* | (2006.01) |
| *B65D 23/10* | (2006.01) |
| *B65D 1/02* | (2006.01) |
| *H01L 21/67* | (2006.01) |
| *B65D 47/06* | (2006.01) |

(52) U.S. Cl.
CPC ........... *B65D 83/14* (2013.01); *B65D 1/0246* (2013.01); *B65D 23/10* (2013.01); *B65D 41/62* (2013.01); *B65D 47/06* (2013.01); *H01L 21/67017* (2013.01)

(58) Field of Classification Search
CPC ................ B65D 83/14; B65D 41/62; B65D 43/00–43/12; B65D 45/00–45/08; B65D 45/16–45/22; B65D 45/32–45/322; B65D 47/04–47/043; B65D 1/0246
See application file for complete search history.

(56) References Cited

U.S. PATENT DOCUMENTS

| | | | | |
|---|---|---|---|---|
| 1,588,883 | A * | 6/1926 | Mayland ............. | B67D 1/0425 215/309 |
| 1,832,570 | A * | 11/1931 | Montgomery ........ | B65D 83/14 141/20 |
| 2,154,393 | A * | 4/1939 | Bates ................... | B67D 1/0425 222/209 |
| 2,190,054 | A * | 2/1940 | Cutter ................. | B65D 51/002 215/247 |
| 2,774,518 | A * | 12/1956 | Greene ............. | B65D 83/0094 215/3 |

(Continued)

FOREIGN PATENT DOCUMENTS

| | | |
|---|---|---|
| KR | 1993-0007916 Y1 | 11/1993 |
| KR | 10-1065627 B1 | 9/2011 |

*Primary Examiner* — Paul R Durand
*Assistant Examiner* — Randall A Gruby
(74) *Attorney, Agent, or Firm* — Lee & Morse P.C.

(57) ABSTRACT

A fluid dispenser includes a bottle having an opening, a fluid dispensing tube inside the bottle, an inner cap having a top surface having first and second openings separated from each other, a lower cylindrical post extending from the top surface and being couplable to the opening of the bottle, and an upper cylindrical post extending from the top surface and in an opposite direction relative to the lower cylindrical post; and a cap connector detachably coupled to the upper cylindrical post, the cap connector expanding and contracting between an expansion position and a contraction position and providing an extension path of the fluid dispensing tube in the bottle.

20 Claims, 14 Drawing Sheets

(56) References Cited

U.S. PATENT DOCUMENTS

| Patent/Pub. No. | | Date | Inventor | Class |
|---|---|---|---|---|
| 2,805,798 | A * | 9/1957 | Sampson | G01F 11/028 222/309 |
| 3,084,691 | A * | 4/1963 | Stoner | A61M 1/0023 215/309 |
| 3,374,927 | A * | 3/1968 | Schmidt | B67B 7/26 222/400.7 |
| 3,512,806 | A * | 5/1970 | Fullmer | A61M 5/162 215/309 |
| 3,604,602 | A * | 9/1971 | Lee | B65D 83/32 222/399 |
| 4,436,227 | A * | 3/1984 | Johnson, Jr. | B67D 1/0425 222/382 |
| 4,517,445 | A * | 5/1985 | Tatsumi | A47J 31/50 215/13.1 |
| 4,550,864 | A * | 11/1985 | Tarozzi | B67D 1/0425 222/209 |
| 4,667,856 | A * | 5/1987 | Nelson | B67D 1/10 215/280 |
| 4,700,861 | A * | 10/1987 | Neward | B67D 3/00 141/46 |
| 4,706,847 | A * | 11/1987 | Sankey | B67D 1/04 137/329.4 |
| 4,784,299 | A * | 11/1988 | Stenger | B67D 1/0829 222/397 |
| 4,920,766 | A * | 5/1990 | Yamamoto | F25B 43/003 285/377 |
| 5,025,955 | A * | 6/1991 | Stenger | B67B 7/26 222/400.8 |
| 5,114,033 | A * | 5/1992 | Golias | G01N 1/10 222/211 |
| 5,154,112 | A * | 10/1992 | Wettern | B01F 3/04794 215/228 |
| 5,197,866 | A * | 3/1993 | Kim | B67D 1/0425 222/209 |
| 5,207,339 | A * | 5/1993 | Shyu | B65B 31/00 141/65 |
| 5,350,080 | A * | 9/1994 | Brown | B67D 7/0288 215/247 |
| 5,465,875 | A * | 11/1995 | Garnett | A01M 7/0092 134/166 R |
| 5,586,588 | A * | 12/1996 | Knox | B67D 1/04 141/18 |
| 5,740,949 | A * | 4/1998 | Park | B67D 1/0425 222/209 |
| 5,823,372 | A * | 10/1998 | Levine | B65B 31/047 215/228 |
| 6,425,421 | B1 * | 7/2002 | Morrison | A47G 23/0241 141/64 |
| 6,698,619 | B2 * | 3/2004 | Wertenberger | B65D 77/06 222/105 |
| 6,817,485 | B2 | 11/2004 | Kawai et al. | |
| 7,025,234 | B2 * | 4/2006 | Priebe | B67D 1/0054 137/563 |
| 7,434,814 | B2 * | 10/2008 | Kumakura | F16L 5/10 16/2.1 |
| 7,533,701 | B2 * | 5/2009 | Gadzic | B67D 7/02 141/302 |
| 8,322,571 | B2 | 12/2012 | Hovinen et al. | |
| 8,931,503 | B2 * | 1/2015 | Walkowski | B60K 15/04 137/209 |
| 8,985,359 | B2 * | 3/2015 | Bear | B01L 3/50825 215/309 |
| 9,061,878 | B2 * | 6/2015 | Lambrecht | B67D 1/0412 |
| 9,079,758 | B2 | 7/2015 | O'Dougherty et al. | |
| 9,091,924 | B2 | 7/2015 | George et al. | |
| 9,433,556 | B2 * | 9/2016 | Osborn | A61J 1/2089 |
| 2009/0302597 | A1 * | 12/2009 | Takanohashi | B67D 7/0283 285/29 |
| 2011/0100481 | A1 * | 5/2011 | Takanohashi | B67D 7/0261 137/315.01 |
| 2011/0226806 | A1 * | 9/2011 | O'Dougherty | B67D 7/0261 222/1 |
| 2012/0037625 | A1 * | 2/2012 | Hasunuma | B67D 7/0294 220/200 |
| 2012/0199207 | A1 * | 8/2012 | McAdams | B01F 11/0005 137/1 |
| 2013/0130399 | A1 | 5/2013 | Mills et al. | |
| 2014/0175129 | A1 * | 6/2014 | Croibier | B05B 11/0097 222/321.9 |
| 2014/0175133 | A1 * | 6/2014 | Metropulos | B67D 1/0802 222/400.7 |
| 2015/0102070 | A1 * | 4/2015 | Mueh | B67D 7/025 222/400.7 |

* cited by examiner

FLUID DISPENSER

CROSS-REFERENCE TO RELATED APPLICATION

Korean Patent Application No. 10-2016-0138644, filed on Oct. 24, 2016, in the Korean Intellectual Property Office, and entitled: "Fluid Dispenser," is incorporated by reference herein in its entirety.

BACKGROUND

1. Field

The present disclosure relates to a fluid dispenser, and more particularly, to a fluid dispenser, which accommodates fluid for fabricating a semiconductor device and is used for storing, transporting, and dispensing the fluid.

2. Description of the Related Art

Generally, a semiconductor device may be fabricated by repeatedly performing various processes such as a photolithography process, an etching process, a deposition process, a diffusion process, an ion implantation process, and the like. A semiconductor device fabrication apparatus may include a fluid dispenser for providing a chemical solution required for the fabrication of a semiconductor device. For example, spinner equipment for applying photoresist onto a wafer is used in a photolithography process, and the spinner equipment includes a photoresist dispenser for storing, transporting, and dispensing photoresist by accommodating the photoresist before supplying the photoresist onto the wafer.

SUMMARY

According to an aspect of embodiments, there is provided a fluid dispenser including a bottle having an opening; an inner cap having a top surface, a lower cylindrical post, and an upper cylindrical post, the top surface including first and second openings spaced apart from each other, the lower cylindrical post extending from the top surface and being coupleable to the opening, and the upper cylindrical post extending in opposition to the lower cylindrical post with respect to the top surface; and a cap connector detachably coupled to the upper cylindrical post, the cap connector being extensible and shrinkable between an extension position and a shrinkage position and providing an extension path of a fluid dispensing tube, which extends from the inside of the bottle.

According to another aspect of embodiments, there is provided a fluid dispenser including a bottle, which has an opening including a first screw portion; an inner cap having a top surface, a lower cylindrical post, and an upper cylindrical post, the top surface comprising first, second, and third openings spaced apart from each other, the lower cylindrical post vertically extending from an edge of the top surface in a first direction and having an inner wall, which includes a second screw portion fastenable to the first screw portion, and the upper cylindrical post protruding from the top surface in a second direction, which is opposite to the first direction, and having a diameter that is less than a diameter of the top surface; a cap connector detachably coupled to the upper cylindrical post, the cap connector being extensible and shrinkable between an extension position and a shrinkage position along the first direction and the second direction and providing an extension path of a fluid dispensing tube, which extends from the outside of the bottle to the inside of the bottle through the first opening; and an outer cap, which is coupleable to a portion of the inner cap while pressing the cap connector such that the cap connector is maintained at the shrinkage position.

According to yet another aspect of embodiments, there is provided a fluid dispenser, including a bottle having an opening, an inner cap including a top surface having first and second openings separated from each other, a lower cylindrical post extending from the top surface and being coupleable to the opening of the bottle, and an upper cylindrical post extending from the top surface and in an opposite direction relative to the lower cylindrical post, a cap connector detachably coupled to the upper cylindrical post, the cap connector being contractible, and a fluid dispensing tube inside the bottle, the fluid dispensing tube extending from the bottle through the inner cap and through the cap connector.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
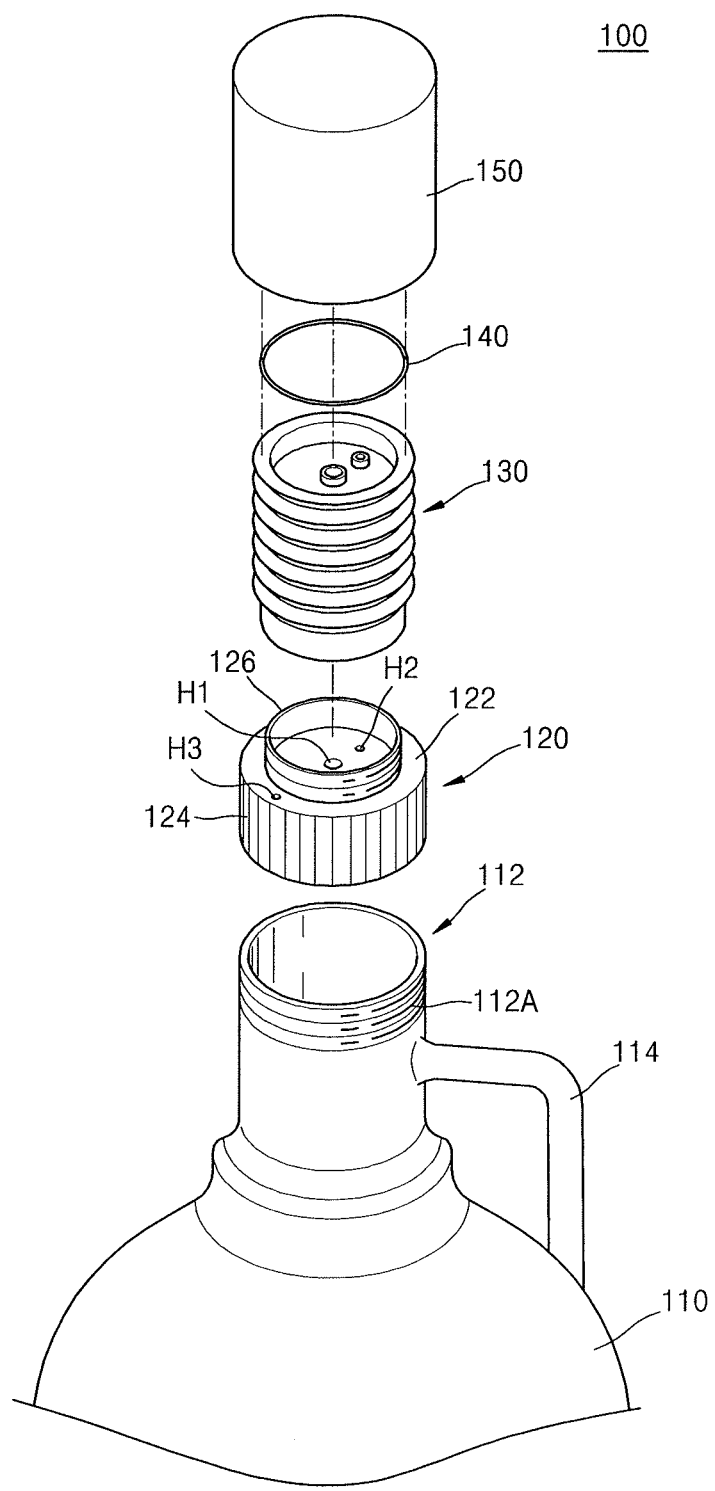
FIG. 1 illustrates an exploded perspective view of a main configuration of a fluid dispenser according to embodiments.

Hereinafter, embodiments will be described in detail with reference to the accompanying drawings. Like components will be denoted by like reference numerals throughout the specification, and repeated descriptions thereof will be omitted.

FIG. 1 is an exploded perspective view illustrating a main configuration of a fluid dispenser according to embodiments.

Referring to FIG. 1, a fluid dispenser 100 may include a bottle 110, an inner cap 120, a cap connector 130, an O-ring 140, and an outer cap 150. The inner cap 120, cap connector 130, O-ring 140, and outer cap 150 are coupled onto an opening 112 of the bottle 110 in the stated order.

In detail, the O-ring 140 may be arranged between the cap connector 130 and the outer cap 150, and may perform sealing such that a sealing space is provided between the cap connector 130 and the outer cap 150. The inner cap 120, the cap connector 130, the O-ring 140, and the outer cap 150 provide a multi-cap structure for closing or sealing the opening 112 of the bottle 110.

The bottle 110 may accommodate fluid, e.g., a chemical solution used in the fabrication of a semiconductor device. The bottle 110 may include, e.g., may be formed of, a polymer, a metal, an alloy, or combinations thereof. The fluid capable of being accommodated in the bottle 110 is not particularly limited. The bottle 110 may be used to transport, store, or dispense a chemical solution needed during semiconductor device fabrication processes. For example, various fluids, e.g., a photoresist, an acid, a base, a solvent, a slurry, a cleaning solution, a dopant, an inorganic solution, an organic solution, and/or a metal organic solution, may be accommodated in the bottle 110.

A first screw portion 112A is formed on an outer circumferential surface of the opening 112 of the bottle 110. The first screw portion 112A may include screw threads. The opening 112 of the bottle 110 may be sealed by the inner cap 120. The bottle 110 may include a handle 114 to facilitate the handling of the bottle 110.

The inner cap 120 may include a top surface 122, a lower cylindrical post 124 vertically extending from an edge of the top surface 122 in a first direction (downward direction in FIG. 1), and an upper cylindrical post 126 protruding from the top surface 122 in a second direction (upward direction in FIG. 1), which is opposite to the first direction. An uneven structure may be formed on an outer surface of the lower cylindrical post 124. The uneven structure may facilitate the rotation of the inner cap 120 by providing frictional force when the inner cap 120 is rotated to open or close the opening 112 of the bottle 110.

Figure 2:
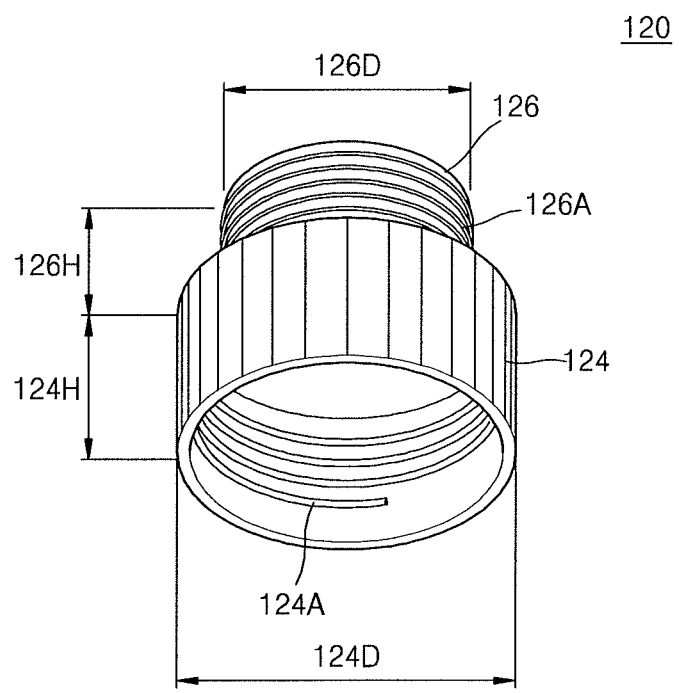
FIG. 2 illustrates a perspective view of an inner cap in a fluid dispenser according to embodiments.

FIG. 2 is an enlarged perspective view of the inner cap 120.

Referring to FIG. 2, a second screw portion 124A, which is fastenable to the first screw portion 112A on the outer circumferential surface of the opening 112 of the bottle 110, is formed on an inner wall of the lower cylindrical post 124 of the inner cap 120. The second screw portion 124A may include thread grooves.

A third screw portion 126A is formed on an outer sidewall of the upper cylindrical post 126. The third screw portion 126A may include screw threads. A diameter 126D of the upper cylindrical post 126 may be less than a diameter of the top surface 122 and less than a diameter 124D of the lower cylindrical post 124. A height 126H of the upper cylindrical post 126 may be less than a height 124H of the lower cylindrical post 124, without being limited thereto.

Referring again to FIG. 1, a first opening H1, a second opening H2, and a third opening H3 are formed at positions separated from each other in the top surface 122 of the inner cap 120 and penetrate the inner cap 120. In some embodiments, the first opening H1, the second opening H2, and the third opening H3 may have circular planar shapes having different diameters. In some other embodiments, the first opening H1, the second opening H2, and the third opening H3 may have circular planar shapes having an equal diameter. The fluid in the bottle 110 may be dispensed out of the bottle 110 through the first opening H1. Inert gas, e.g., nitrogen gas, may flow into the bottle 110 at certain pressure through the second opening H2. When inert gas at certain pressure is supplied into the bottle 110, which has a sealed environment, through the second opening H2, the fluid accommodated in the bottle 110 may flow out of the bottle 110 through the first opening H1 by the pressure of the inert gas. The third opening H3 may be used as a drain hole. For example, when the fluid flowing out of the bottle 110 through the first opening H1 of the inner cap 120 is leaked and unwantedly remains on the inner cap 120 before being dispensed out of the bottle 110 through the outer cap 150, the remaining fluid may flow back into the bottle 110 through the third opening H3.

The first opening H1 and the second opening H2 may be arranged inside a region of the top surface 122 of the inner cap 120, and the third opening H3 may be arranged outside the region of the top surface 122 of the inner cap 120, the region being surrounded by the upper cylindrical post 126. In other words, the first opening H1 and the second opening H2 may be arranged in a portion of the top surface 122 surrounded by the upper cylindrical post 126, while the third opening H3 may be arranged in a portion of the top surface 122 outside the upper cylindrical post 126.

The cap connector 130 may be detachably coupled to the upper cylindrical post 126 of the inner cap 120. The cap connector 130 may provide an extension path of a fluid dispensing tube, e.g., a fluid dispensing tube 104 of FIG. 4, the fluid dispensing tube extending into the bottle 110 through the first opening H1 of the inner cap 120. The cap connector 130 may be configured to expand and contract between an expansion position and a contraction position.

Figure 3A:
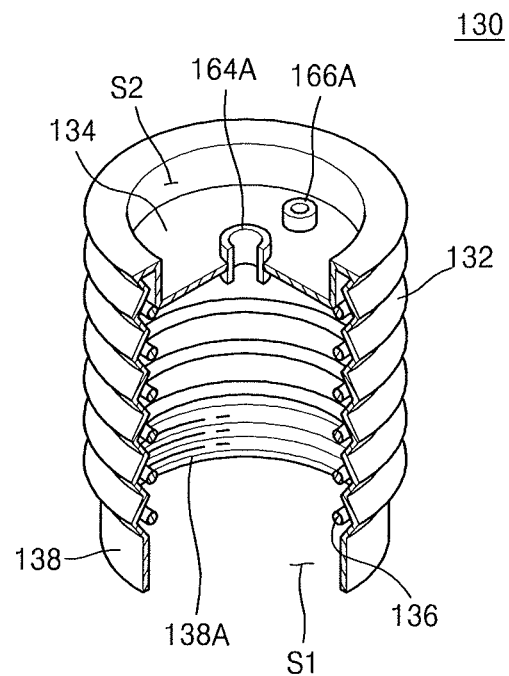
FIG. 3A illustrates a partially cutaway perspective view of a cap connector in a fluid dispenser according to embodiments.
Figure 3B:
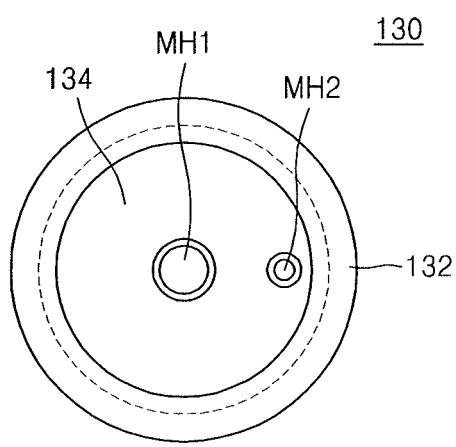
FIG. 3B illustrates a plan view of a cap connector in a fluid dispenser according to embodiments.

FIG. 3A is an enlarged and partially cutaway perspective view of the cap connector 130 of FIG. 1. FIG. 3B is a plan view of the cap connector 130.

Figure 4:
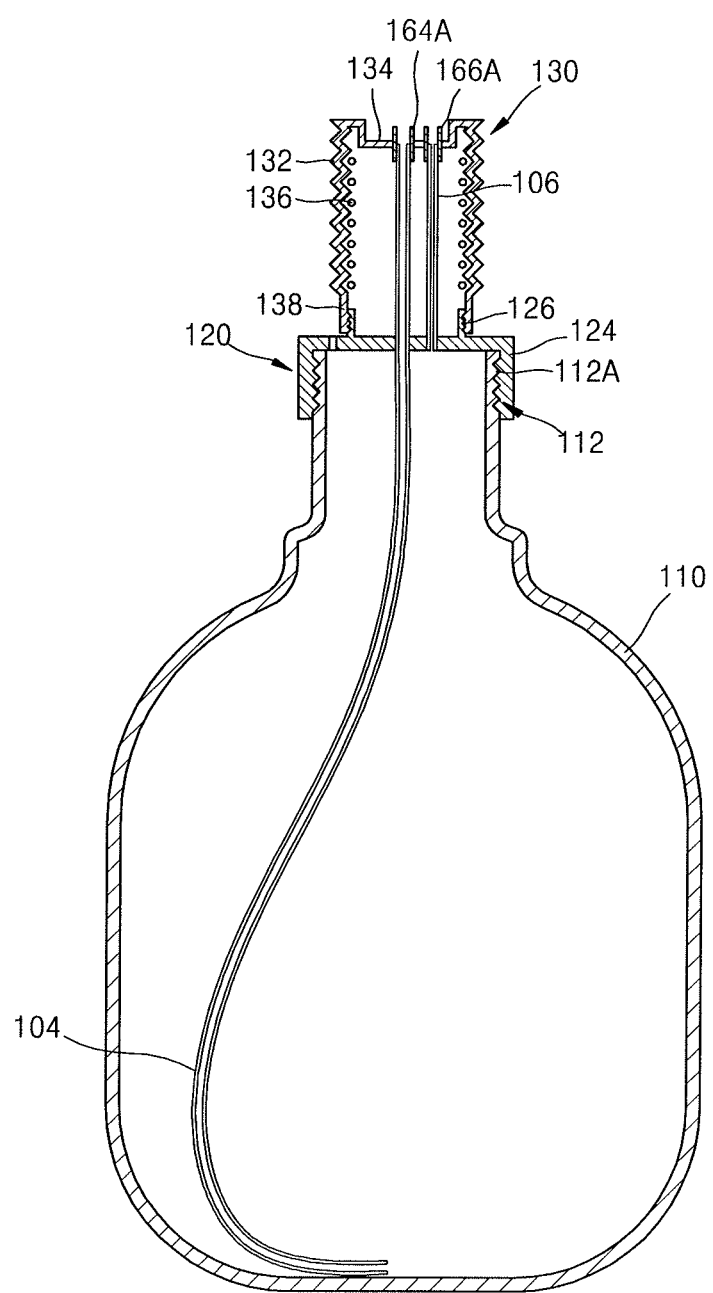
FIG. 4 illustrates a cross-sectional view of an inner cap and a cap connector coupled to an opening of a bottle in a fluid dispenser according to embodiments.

Referring to FIGS. 3A and 3B, the cap connector 130 may include a cylindrical corrugated bellows 132, which defines an inner space S1 providing a path of a fluid dispensing tube, e.g., the fluid dispensing tube 104 of FIG. 4. The cap connector 130 may further include a recess top surface 134 at a first end of the corrugated bellows 132, the recess top surface partially closing the inner space S1 of the corrugated bellows 132, a coil spring 136 in the inner space S1, the coil spring 136 being surrounded by the corrugated bellows 132, and a bellows coupling portion 138 integrally connected to a second end of the corrugated bellows 132. The recess top surface 134 may be recessed from the first end of the corrugated bellows 132 toward the inner space S1.

The corrugated bellows 132 may include, e.g., a polymer, a metal, an alloy, or combinations thereof. The coil spring 136 may include a metal or an alloy.

The recess top surface 134 may extend flat in a direction parallel to the top surface 122 of the inner cap 120. An upper limit of the inner space S1 may be defined by the recess top surface 134. In addition, a sealing space S2 may be defined over the cap connector 130 by the recess top surface 134.

A first intermediate opening MH1 penetrable by a fluid dispensing tube, e.g., the fluid dispensing tube 104 of FIG. 4, and a second intermediate opening MH2, which is penetrable by a gas supply tube and arranged in the vicinity of the first intermediate opening MH1, are formed in the recess top surface 134. The first intermediate opening MH1 and the second intermediate opening MH2 may be respectively arranged at positions corresponding to, e.g., overlapping, the first opening H1 and the second opening H2, which penetrate the top surface 122 of the inner cap 120.

The bellows coupling portion 138 extends from the second end of the corrugated bellows 132 and defines a portion of the inner space S1. A fourth screw portion 138A is formed on an inner sidewall of the bellows coupling portion 138, the fourth screw portion 138A being fastenable to the third screw portion 126A on the outer sidewall of the upper cylindrical post 126. The fourth screw portion 138A may include thread grooves. Although the bellows coupling portion 138 is shown as being screw-coupled to the upper cylindrical post 126 of the inner cap 120 in this example, embodiments are not limited thereto. For example, the bellows coupling portion 138 of the cap connector 130 may be detachably coupled to the upper cylindrical post 126 of the inner cap 120 by various methods, e.g., snap fit, friction fit, and the like.

FIG. 4 is a cross-sectional view illustrating a state in which the inner cap 120 and the cap connector 130 are coupled to the opening 112 of the bottle 110 in this stated order.

Referring to FIG. 4, a first connector 164A may be connected to a first end of the fluid dispensing tube 104. The first connector 164A may be fitted into the first intermediate opening MH1 in the recess top surface 134 of the cap connector 130. The fluid dispensing tube 104 may extend from the first connector 164A in the cap connector 130 through the cap connector 130, through the first opening H1 in the inner cap 120, and into the bottle 110, e.g., the fluid dispensing tube 104 may extend to the bottom of the bottle 110.

A second connector 166A may be fitted into the second intermediate opening MH2 in the recess top surface 134 of the cap connector 130. While s first end of a gas supply tube 106 for supplying inert gas into the bottle 110 is fixed to the second connector 166A, the gas supply tube 106 may extend along the inner space S1 of the cap connector 130 and penetrate the second opening H2 in the top surface 122 of the inner cap 120. Thus, the second end of the gas supply tube 106 may be open to the inside of the bottle 110.

When inert gas is introduced into the bottle 110 through the gas supply tube 106, the fluid accommodated in the bottle 110 may be supplied from the inside of the bottle 110 to the outside of the bottle 110 through the fluid dispensing tube 104 and the first connector 164A due to the pressure of the introduced inert gas. The fluid dispensing tube 104 may include a flexible tube including a material such as resin or synthetic rubber. Depending upon the kind of fluid accommodated in the bottle 110, the fluid dispensing tube 104 may include a material having high resistance to the fluid. In some embodiments, the fluid dispensing tube 104 may include polyolefin resin, polyester resin, fluorine-containing resin, or combinations thereof. For example, the fluid dispensing tube 104 may include Teflon®. The fluid dispensing tube 104 is long enough to contact the inner bottom of the bottle 110, thereby maximizing the usage of the fluid in the bottle 110 and minimizing the amount of fluid remaining in the bottle 110 after the discharge of the fluid.

Shapes and structures of the first connector 164A and the second connector 166A are not particularly limited, and any convenient connectors may be used as the first connector 164A and the second connector 166A. In some embodiments, the first connector 164A and the second connector 166A may include quick connectors, to which two separated tubes may be fastened in axial directions thereof, respectively. For example, the fluid dispensing tube 104 may be fixed in a state of being fitted into the first connector 164A through one end of the first connector 164A. In addition, the gas supply tube 106 may be fixed in a state of being fitted into the second connector 166A through one end of the second connector 166A. Each of the first connector 164A and the second connector 166A may include resin, synthetic rubber, a metal, an alloy, or combinations thereof.

Referring again to FIG. 1, the outer cap 150 may be coupled to a portion of the inner cap 120 while pressing the cap connector 130 such that the cap connector 130 is maintained at the contraction position.

Figure 5A:
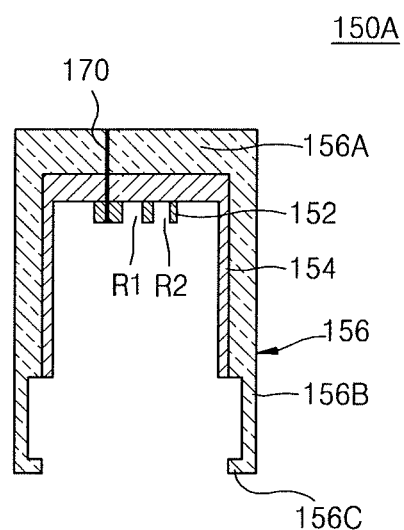
FIGS. 5A and 5B illustrate cross-sectional views of examples of an outer cap in a fluid dispenser according to embodiments.
Figure 5B:
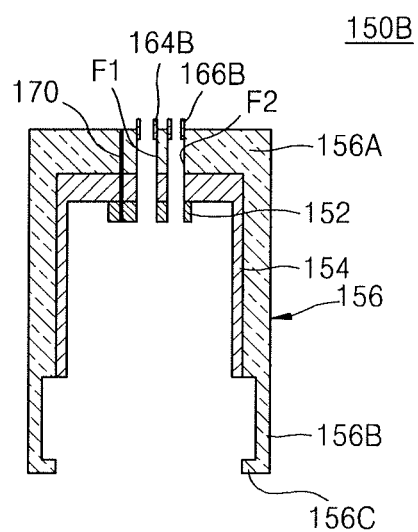

FIGS. 5A and 5B are cross-sectional views respectively illustrating example configurations of variously structured outer caps capable of being used as the outer cap 150 of the fluid dispenser 100 shown in FIG. 1. In FIGS. 5A and 5B, the same reference numerals denote the same elements, and descriptions thereof will be omitted.

An outer cap 150A shown in FIG. 5A may be used when fluid is transported or preserved while accommodated in the bottle 110. The outer cap 150A may seal the opening 112 of the bottle 110 as well as the inner cap 120 and the cap connector 130, which are coupled onto the opening 112.

More specifically, the outer cap 150A may have a structure in which a sealing insertion unit 152, a sealing cover 154, and a fixing cover 156 are assembled in this stated order. The sealing insertion unit 152, the sealing cover 154, and the fixing cover 156 may be configured as an assembly in which the sealing insertion unit 152, the sealing cover 154, and the fixing cover 156 are penetrated and connected in this stated order by at least one fixture 170.

The sealing insertion unit 152 may be configured to be insertable into the sealing space S2 (see FIGS. 3A and 3B) defined by the recess top surface 134 of the cap connector 130. A first receiving space R1 and a second receiving space R2 are formed in the sealing insertion unit 152. When the outer cap 150A is fixed onto the cap connector 130, a portion of the first connector 164A (see FIG. 4), to which the first end of the fluid dispensing tube 104 is fixed, may be received in the first receiving space R1, and a portion of the second connector 166A (see FIG. 4), to which the first end of the gas supply tube 106 is fixed, may be received in the second receiving space R2.

The sealing cover 154 may be coupled onto the sealing insertion unit 152. When the sealing insertion unit 152 is inserted into the sealing space S2 defined by the recess top surface 134, the sealing cover 154 may surround the corrugated bellows 132 and seal the cap connector 130.

The fixing cover 156 may be coupled onto the sealing cover 154. The fixing cover 156 may include a cover body 156A covering the sealing cover 154, and a plurality of clamp arms 156B, which are connected to the cover body 156A and coupleable to the inner cap 120. The sealing insertion unit 152 and the sealing cover 154 may be coupled to the cover body 156A of the fixing cover 156 by the at least one fixture 170. A clamp 156C, which is coupleable to an end of the lower cylindrical post 124 of the inner cap 120, is formed at an end of each of the plurality of clamp arms 156B.

An outer cap 150B shown in FIG. 5B may be used when the fluid accommodated in the bottle 110 is dispensed to the outside of the bottle 110, e.g., to a semiconductor device fabrication apparatus. The outer cap 150B shown in FIG. 5B has substantially the same configuration as the outer cap 150A shown in FIG. 5A. However, a first flow path F1 and a second flow path F2 are formed in the outer cap 150B shown in FIG. 5B and penetrate the sealing insertion unit 152, the sealing cover 154, and the cover body 156A of the fixing cover 156.

A first end of the first flow path F1 may be connected to a third connector 164B outside the fixing cover 156, and a second end of the first flow path F1 may be open to the inside of the fixing cover 156. When the sealing insertion unit 152 is inserted into the sealing space S2 (see FIG. 3A) defined by the recess top surface 134, the second end of the first flow path F1, which is open to the inside of the fixing cover 156, and the first intermediate opening MH1 (see FIG. 3B) in the recess top surface 134 may face and communicate with each other.

A first end of the second flow path F2 may be connected to a fourth connector 166B outside the fixing cover 156, and a second end of the second flow path F2 may be open to the inside of the fixing cover 156. When the sealing insertion unit 152 is inserted into the sealing space S2 (see FIG. 3A) defined by the recess top surface 134, the second end of the second flow path F2, which is open to the inside of the fixing cover 156, and the second intermediate opening MH2 (see FIG. 3B) in the recess top surface 134 may face and communicate with each other.

Regarding descriptions of the third connector 164B and the fourth connector 166B, reference may be made to the descriptions of the first connector 164A and the second connector 166A, which have been described with reference to FIG. 4.

Figure 6:
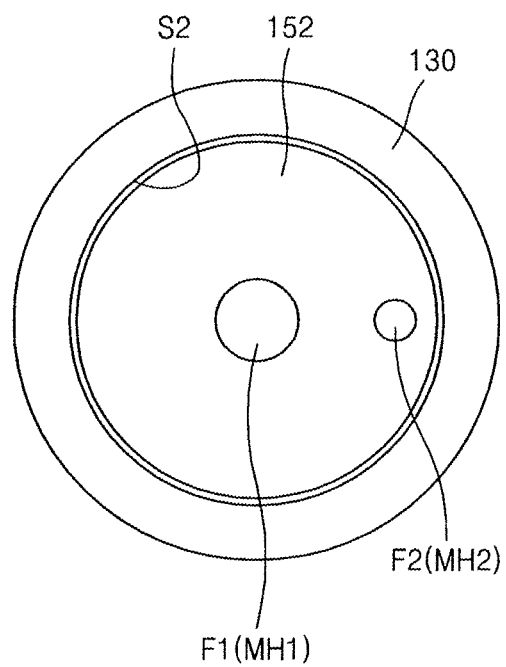
FIG. 6 illustrates a plan view of a relative arrangement of a sealing space of a cap connector and a sealing insertion unit of an outer cap, when the sealing insertion unit is inserted into the sealing space, which is defined by a recess top surface of the cap connector, in a fluid dispenser according to embodiments.

FIG. 6 is a plan view illustrating a relative arrangement of the sealing space S2 of the cap connector 130 and the sealing insertion unit 152 of the outer cap 150B, when the sealing insertion unit 152 is inserted into the sealing space S2 (see FIG. 3A), which is defined by the recess top surface 134 of the cap connector 130.

As shown in FIG. 6, the sealing space S2 defined by the recess top surface 134 of the cap connector 130 may have a circular planar shape, and the sealing insertion unit 152 inserted into the sealing space S2 may also have a circular planar shape corresponding to the planar shape of the sealing space S2.

FIGS. 7A to 7H are plan views illustrating various modifications of the planar shape of the recess top surface 134 of the cap connector 130 available to the fluid dispenser according to embodiments, and various modifications of the sealing insertion unit 152 inserted into the sealing space S2 defined by the recess top surface 134.

As shown in FIGS. 7A to 7H, the sealing space S2 defined by the recess top surface 134 of the cap connector 130 may include a circular recess CR and at least one protruding recess PR communicating with the circular recess CR and protruding out of the circular recess CR. The sealing space S2 may have various planar shapes obtained by various combinations of the circular recess CR and the at least one protruding recess PR.

The sealing insertion unit 152 may include a circular insertion portion CI having a shape corresponding to the circular recess CR, and at least one protruding insertion portion PI, which is integrally coupled to the circular insertion portion CI, protruding from the circular insertion portion CI and having a shape corresponding to the at least one protruding recess PR. The sealing insertion unit 152 may have various planar shapes obtained by various combinations of the circular insertion portion CI and the at least one protruding insertion portion PI. When the sealing insertion unit 152 is inserted into the sealing space S2 defined by the recess top surface 134, the at least one protruding insertion portion PI may be inserted into the at least one protruding recess PR.

The fluid dispenser according to embodiments may include the recess top surface 134 having various shapes and the sealing insertion unit 152 having various shapes, as described with reference to FIGS. 7A to 7H, and the recess top surface 134 and the sealing insertion unit 152 may have different shapes from each other depending upon the kind of fluid used in the semiconductor device fabrication processes. For example, the sealing insertion unit 152 may include any convenient number of identical protruding insertion portions PI (FIGS. 7A and 7B), variable widths of protruding insertion portions PI (FIG. 7C), variable positions of protruding insertion portions PI (FIG. 7D), variable width and position of protruding insertion portions PI (FIGS. 7E and 7H), etc., so outer caps 150 may be visibly distinguishable from each other in accordance with the fluid therein.

Figure 7A:
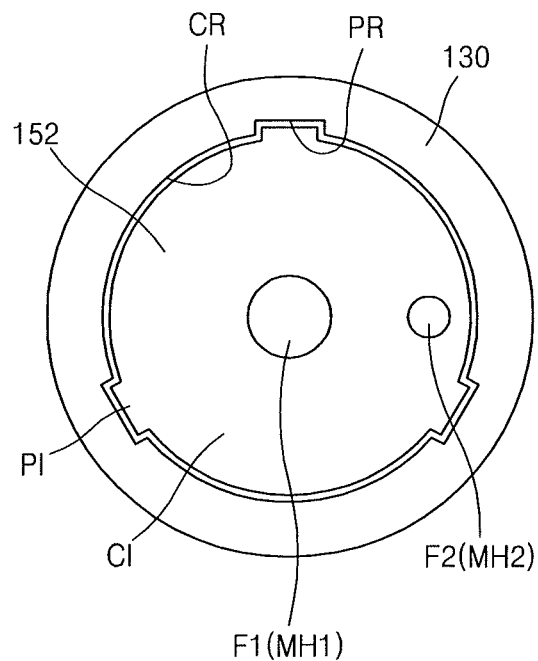
FIGS. 7A to 7H illustrate plan views of various modifications of a relative arrangement of a sealing space of a cap connector and a sealing insertion unit of an outer cap, when the sealing insertion unit is inserted into the sealing space, which is defined by a recess top surface of the cap connector, in a fluid dispenser according to embodiments.
Figure 7B:
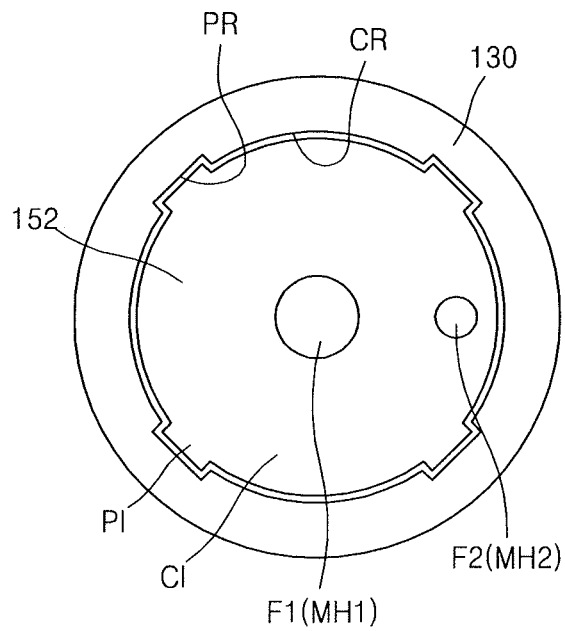
Figure 7C:
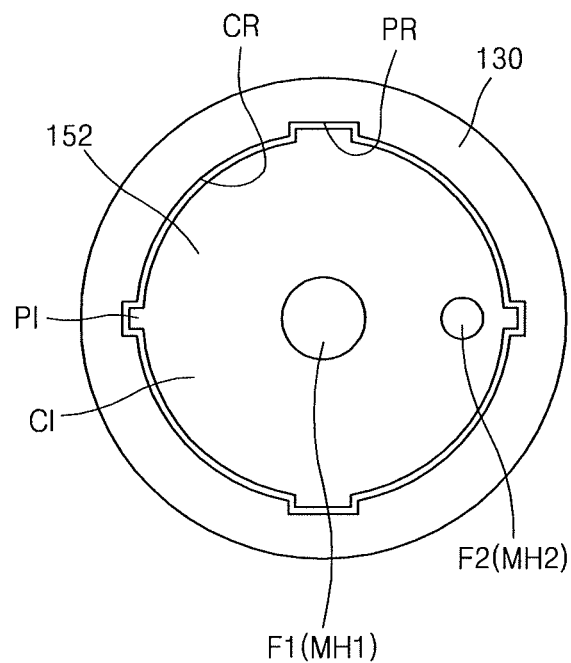
Figure 7D:
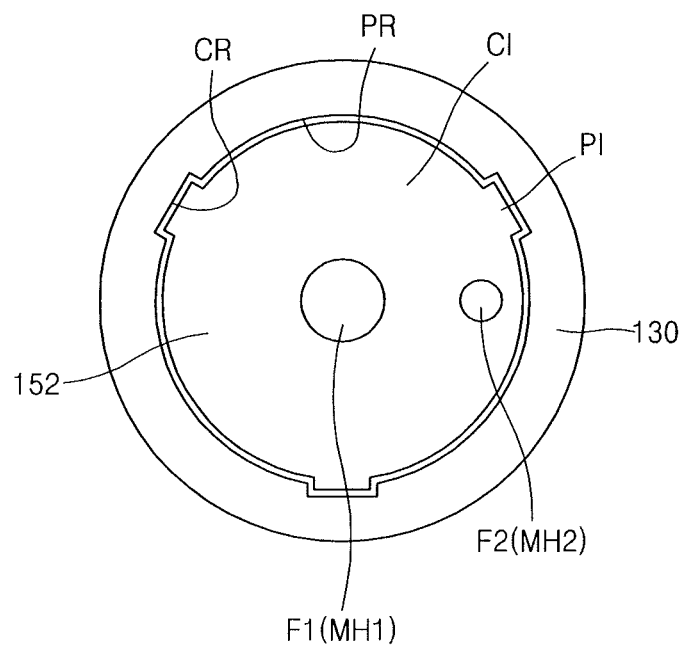
Figure 7E:
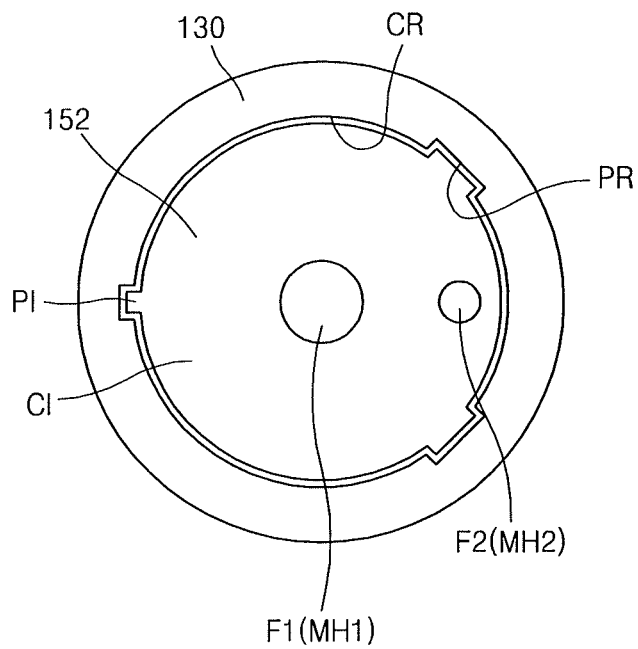
Figure 7F:
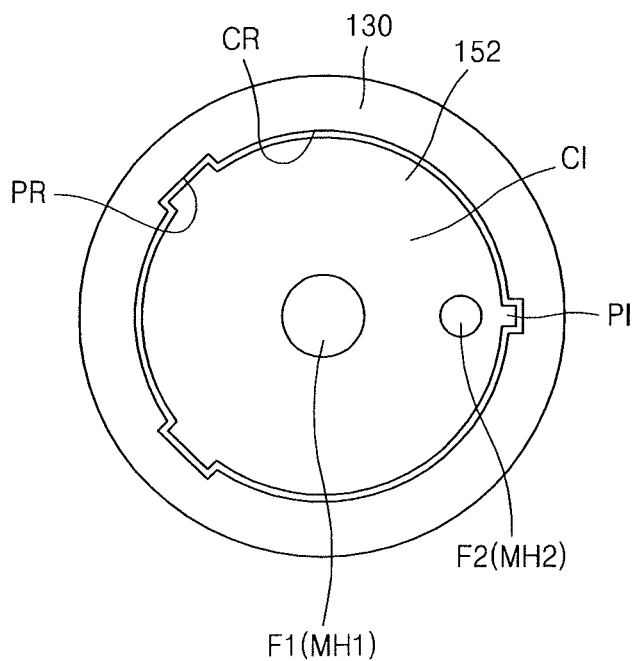
Figure 7G:
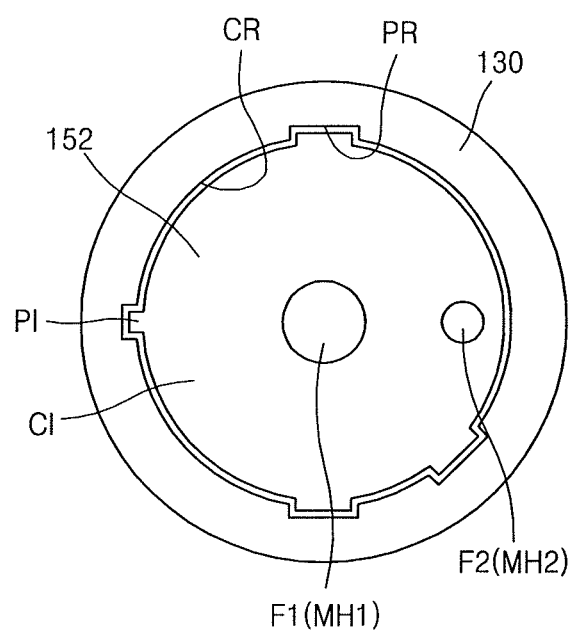
Figure 7H:
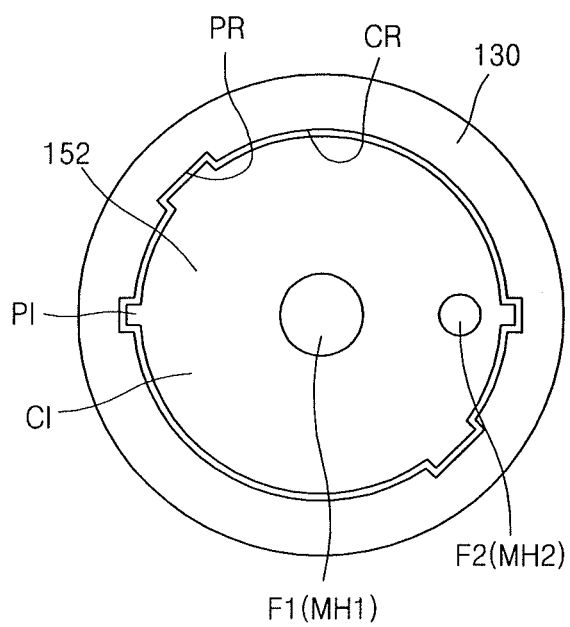

For example, the cap connector 130, which includes the recess top surface 134 configured as shown in FIG. 7A, and the outer cap 150, which includes the sealing insertion unit 152 configured as shown in FIG. 7A, may be coupled to the bottle 110 accommodating photoresist having a first composition. In addition, the cap connector 130, which includes the recess top surface 134 configured as shown in FIG. 7B, and the outer cap 150, which includes the sealing insertion unit 152 configured as shown in FIG. 7B, may be coupled to the bottle 110 accommodating photoresist having a second composition that is different from the first composition. In this way, the occurrence of an unwanted accident such as the incorporation of fluid having a different composition from a composition of the fluid accommodated in the bottle 110 into semiconductor device fabrication processes upon the replacement of the bottle 110 may be prevented. Therefore, even when a plurality of different fluids are used in a same semiconductor device fabrication process, process defects may be prevented from being caused by the incorrect supply of unintended fluid.

Figure 8:
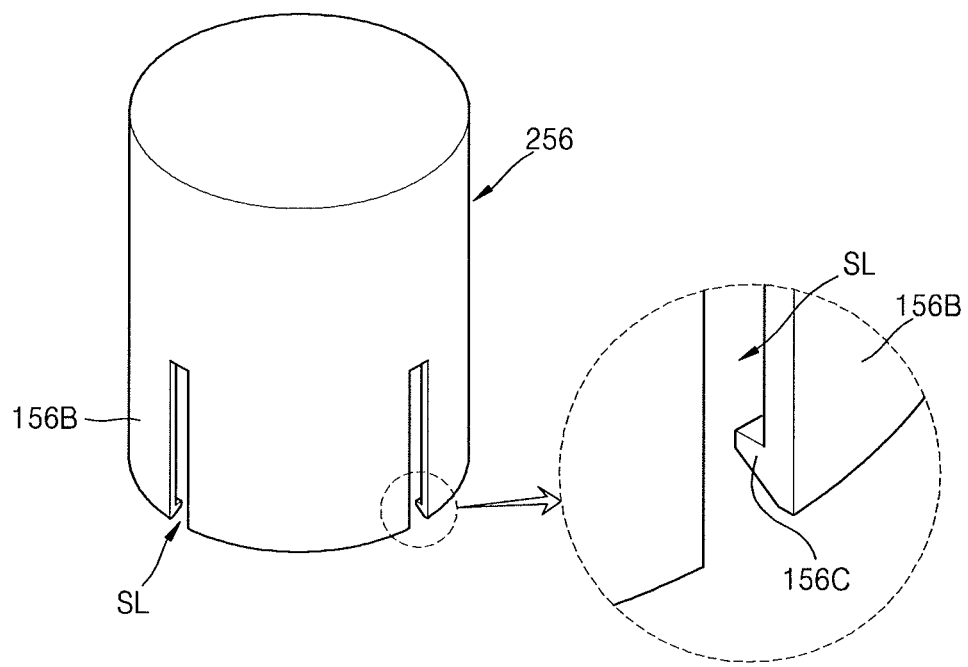
FIG. 8 illustrates a perspective view of a fixing cover in a fluid dispenser according to embodiments.

FIG. 8 is a perspective view illustrating an example configuration of a fixing cover available to a fluid dispenser according to embodiments.

A fixing cover 256 shown in FIG. 8 may be used as the fixing cover 156 included in the outer cap 150, 150A, or 150B. In FIG. 8, the same reference numerals as in FIGS. 1 to 5B denote the same elements, and descriptions thereof will be omitted.

Referring to FIG. 8, a lower portion of the fixing cover 256 is separated into the plurality of clamp arms 156B by a plurality of slits SL. The clamp 156C coupleable, e.g., detachably coupled, to the end of the lower cylindrical post 124 of the inner cap 120 is formed on an inner surface of an end of each of the plurality of clamp arms 156B. In some embodiments, a tip of the clamp 156C may have a slope such that an inner diameter of the fixing cover 256 gradually increases with decreasing distance from a lower end of the fixing cover 256. As such, the tip of the clamp 156C includes a slope, whereby, when the outer cap 150, 150A, or 150B is pressed toward the bottle 110 to couple the fixing cover 256 to the end of the lower cylindrical post 124 of the inner cap 120, a coupling operation, in which the end of the fixing cover 256 passes through the inner cap 120 and is coupled to the end of the inner cap 120, may be facilitated by the slope at the tip of the clamp 156C.

The plurality of clamp arms 156B may be arranged at equal intervals along a circumferential direction of the fixing cover 256. In some embodiments, the fixing cover 256 may include at least three clamp arms 156B. The plurality of slits SL are formed, thereby providing room for ends of the plurality of clamp arms 156B to move as much as a certain distance to reduce or increase the diameter of the fixing cover 256. The diameter of the fixing cover 256 is increased by moving the plurality of clamp arms 156B outwards from the fixing cover 256 as much as a certain distance, thereby enabling the fixing cover 256 to move to perform coupling or decoupling between the plurality of clamps 156C at the ends of the plurality of clamp arms 156B and the end of the lower cylindrical post 124 of the inner cap 120. In some embodiments, when the plurality of clamps 156C are coupled to the end of the lower cylindrical post 124 of the inner cap 120, to decouple the plurality of clamps 156C from the end of the lower cylindrical post 124, some of the plurality of clamp arms 156B, which are arranged along the circumferential direction of the fixing cover 256, are pressed inwards from the fixing cover 256 or pulled outwards from the fixing cover 256, whereby, among the plurality of clamp arms 156B, the other clamp arms 156B, which are not pressed inwards from the fixing cover 256, or the clamp arms 156B pulled outwards from the fixing cover 256 may be spaced apart from the end of the lower cylindrical post 124 of the inner cap 120. Next, the fixing cover 256 may be pulled from the clamp arms 156B, which are spaced apart from the end of the lower cylindrical post 124, among the plurality of clamp arms 156B, thereby decoupling the plurality of clamps 156C from the end of the lower cylindrical post 124 of the inner cap 120.

The fixing cover 256 may include a polymer, a metal, an alloy, or combinations thereof. For example, the fixing cover 256 may include polyethylene, polypropylene, or polytetrafluoroethylene.

Figure 9:
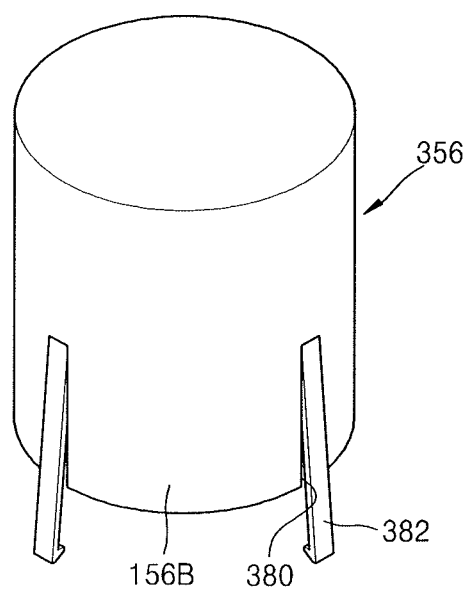
FIG. 9 illustrates a perspective view of another example of a fixing cover in a fluid dispenser according to embodiments.

FIG. 9 is a perspective view illustrating another example configuration of a fixing cover available to a fluid dispenser according to embodiments. A fixing cover 356 shown in FIG. 9 may be used instead of the fixing cover 156 included in the outer cap 150, 150A, or 150B. In FIG. 9, the same reference numerals as in FIGS. 1 to 5B denote the same members, and descriptions thereof will be omitted.

Referring to FIG. 9, in the fixing cover 356, a plurality of slits 380, which extend upwards from an end edge of an outer sidewall of the fixing cover 356 as much as a certain height, are formed at certain intervals along a circumferential direction of the fixing cover 356. The plurality of slits 380 may have an approximately rectangular shape.

The fixing cover 356 includes a plurality of clamp members 382 respectively extending downwards from the tops of the plurality of slits 380. The plurality of clamp members 382 may have a long strip shape. The plurality of clamp members 382 may be formed to be movable between a separation position, at which each clamp member 382 is biased outwards from a sidewall of the fixing cover 356, and a fixing position, at which each clamp member 382 extends parallel to the sidewall of the fixing cover 356. In some embodiments, the plurality of clamp members 382 may be formed integrally with the fixing cover 356. In some other embodiments, the plurality of clamp members 382 may be configured as a separate component from the fixing cover 356, and may be connected to the fixing cover 356 by a general connection means.

The fixing cover 356 may include a polymer, a metal, an alloy, or combinations thereof. For example, the fixing cover 356 may include polyethylene, polypropylene, or polytetrafluoroethylene.

To couple the fixing cover 356 to the end of the lower cylindrical post 124 of the inner cap 120, an end of the fixing cover 356 passes through the inner cap 120, and the plurality of clamp members 382 are located in contiguity with the end of the inner cap 120, followed by pushing the plurality of clamp members 382 radially inwards from the fixing cover 356 to be fixed. When the plurality of clamp members 382 are coupled to the end of the lower cylindrical post 124 of the inner cap 120, to decouple the plurality of clamp members 382 from the end of the lower cylindrical post 124, the plurality of clamp members 382 are pulled radially outwards from the fixing cover 356, thereby returning the plurality of clamp members 382 to a position shown in FIG. 9.

The configurations of the fixing covers 256 and 356 shown in FIGS. 8 and 9 are merely examples, a fixing cover including a plurality of clamps having various structures and operating mechanisms may be used without departing from the scope of the embodiments. For example, the fixing cover 156 shown in FIGS. 5A and 5B may include two clamp arms 156B, which are rotatably coupled to the cover body 156A. The two clamp arms 156B may be coupled to each other via a coil spring including a helical compression spring or a helical extension spring, and the coupling and decoupling between the two clamp arms 156B and the end of the lower cylindrical post 124 of the inner cap 120 may be performed by using the extension or compression of the coil spring and restoring force of the coil spring. However, according to the embodiments, a specific operating mechanism available to the fixing cover 156 is not limited to the mechanisms set forth above, and various changes and modifications may be made without departing from the scope of the embodiments.

Figure 10A:
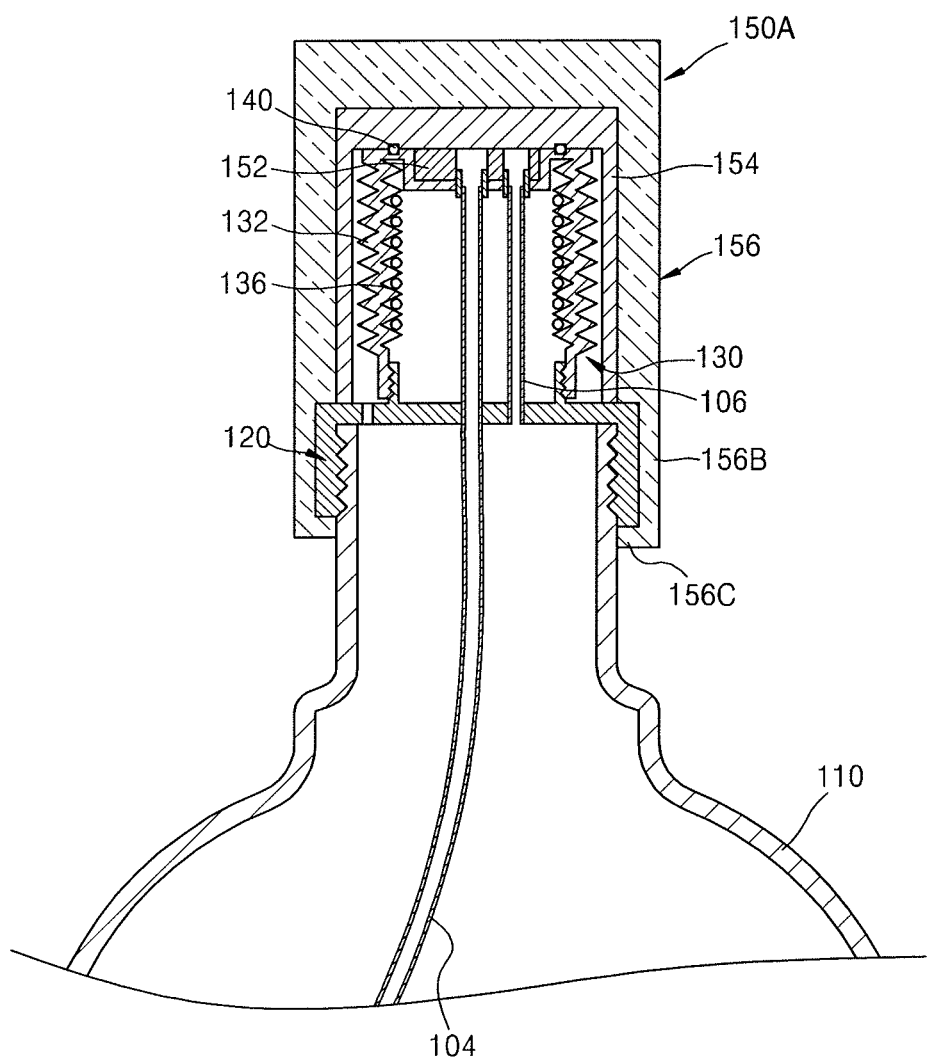
FIG. 10A illustrates a cross-sectional view of a clamp of an outer cap coupled to an end of an inner cap, when the inner cap and a cap connector are coupled to an opening of a bottle, in a fluid dispenser according to embodiments.

FIG. 10A is a cross-sectional view illustrating a state in which the clamp 156C of the outer cap 150A shown in FIG. 5A is coupled to the end of the inner cap 120 by pressing. That is, when the outer cap 150A is pressed against the cap connector 130 via the O-ring 140 to clamp the clamp arms 156B at the lower cylindrical post 124 of the inner cap 120, the corrugated bellows 132 and the coil spring 136 are contracted due to the pressure, thereby setting the cap connector 130 at the contraction position. At the contraction position, the outer cap 150A is coupled to the inner cap 120, with the inner cap 120 and the cap connector 130 coupled to the opening 112 of the bottle 110 in the stated order, as shown in FIG. 4.

Figure 10B:
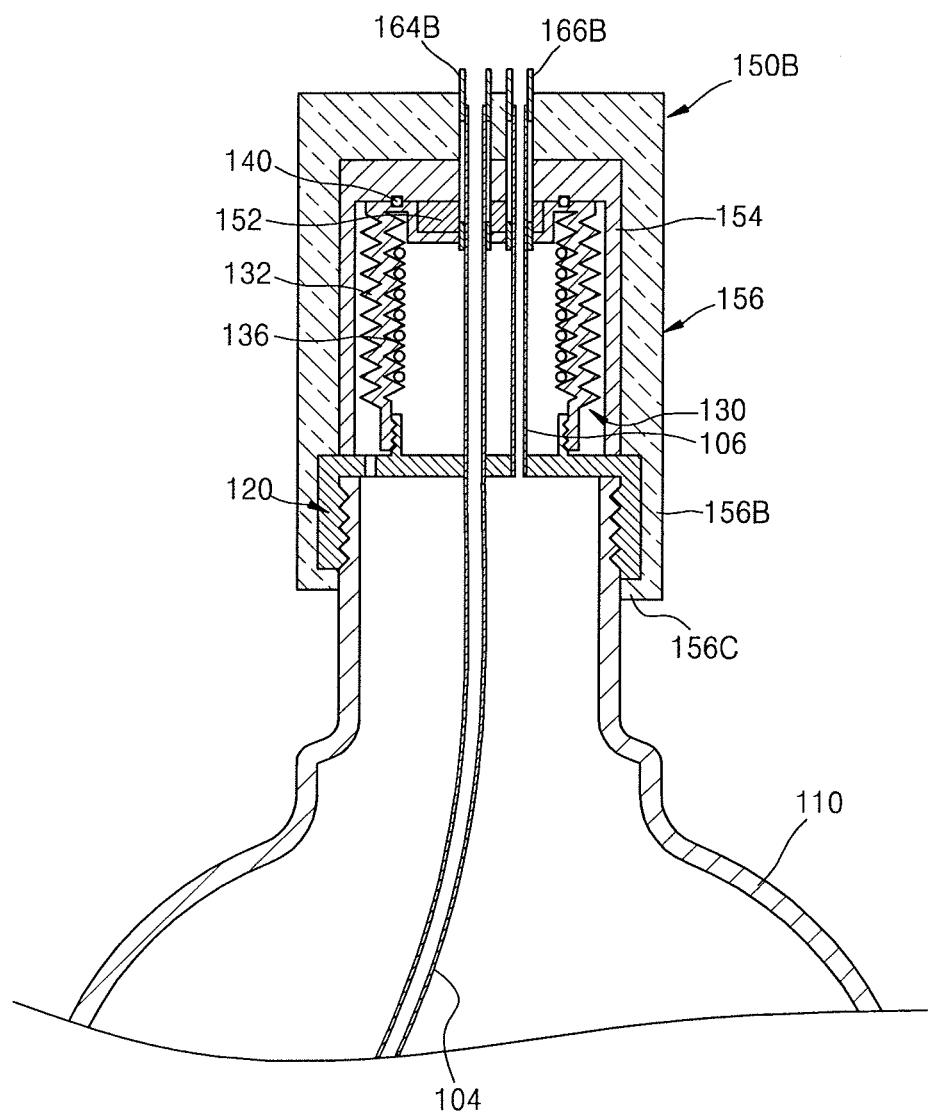
FIG. 10B illustrates a cross-sectional view of a clamp of an outer cap is coupled to an end of an inner cap, when the inner cap and a cap connector are coupled to an opening of a bottle, in a fluid dispenser according to other embodiments.

FIG. 10B is a cross-sectional view illustrating a state in which the clamp 156C of the outer cap 150B shown in FIG. 5B is coupled to the end of the inner cap 120 by pressing. That is, the outer cap 150B is pressed against the cap connector 130 via the O-ring 140 to clamp the clamp arms 156B at the lower cylindrical post 124 of the inner cap 120, as discussed above with reference to FIG. 10A. The cap connector 130 is at the contraction position when the inner cap 120 and the cap connector 130 are coupled to the opening 112 of the bottle 110 in the stated order, as shown in FIG. 4, with the outer cap 150A being coupled to the inner cap 120. In FIGS. 10A and 10B, the fixture 170 is not shown.

When the fluid is transported or preserved while accommodated in the bottle 110, the bottle 110 may be sealed by the outer cap 150A shown in FIG. 10A. Here, the outer cap 150A may function as a cap of the bottle 110. The outer cap 150A may protect the first connector 164A, the second connector 166A, and the surroundings thereof, which are exposed to the outside of the cap connector 130, from being contaminated by an environment external to the cap connector 130.

When the fluid accommodated in the bottle 110 for semiconductor device fabrication processes is dispensed to the outside of the bottle 110, for example, to a semiconductor device fabrication apparatus, the bottle 110 may be sealed by the outer cap 150B, as shown in FIG. 10B. Separate tubes may be respectively connected to the third connector 164B and the fourth connector 166B and dispense the fluid from the bottle 110 or supply inert gas from the outside of the bottle 110 into the bottle 110, the fluid being required for semiconductor device fabrication processes.

The fluid dispenser according to embodiments includes the inner cap 120, the cap connector 130, the O-ring 140, and the outer cap 150, which are coupleable onto the opening 112 of the bottle 110 in this stated order, and the outer cap 150 is configured to be capable of being coupled to and decoupled from the end of the lower cylindrical post 124 of the inner cap 120 in a non-rotation manner. Thus, while the outer cap 150 is coupled to or decoupled from the inner cap 120 to seal the bottle 110, there is no concern of applying physical stress to a tube for dispensing fluid in the bottle 110 to the outside of the bottle 110. In addition, even when a plurality of different fluids are used in semiconductor device fabrication processes, the fluid dispenser includes the cap connector 130 having the recess top surface 134 of various shapes and the outer cap 150, 150A, or 150B having the sealing insertion unit 152 of various shapes, and the recess top surface 134 and the sealing insertion unit 152 have different shapes from each other depending upon fluids used in the semiconductor device fabrication processes, thereby preventing the occurrence of an unwanted accident such as the incorporation of fluid having a different composition from a composition of the fluid accommodated in the bottle 110 into the semiconductor device fabrication processes upon the replacement of the bottle 110. Therefore, even when a plurality of different fluids are used in semiconductor device fabrication processes, process defects may be prevented from being caused by incorrect supply of unintended fluid.

Figure 11:
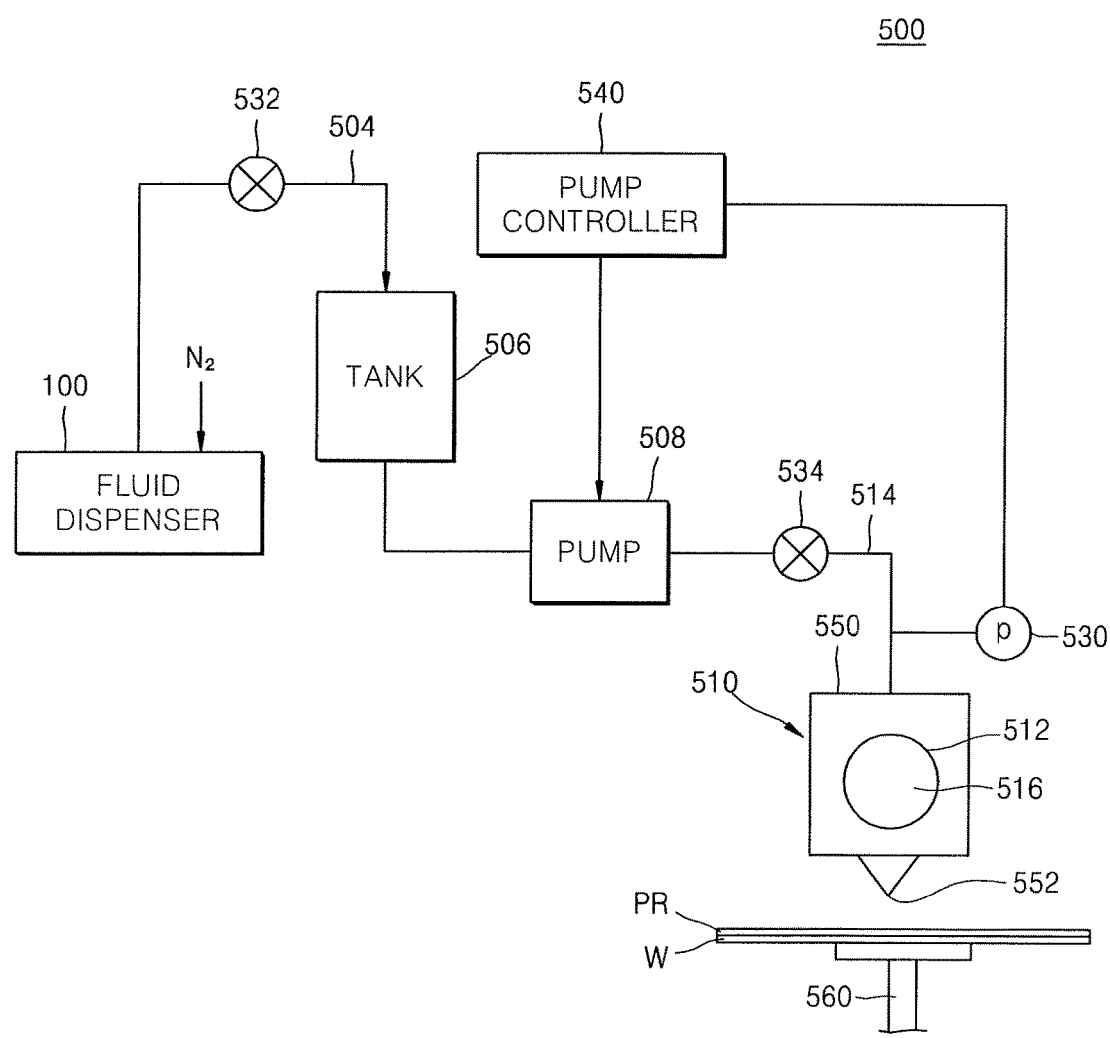
FIG. 11 illustrates a schematic diagram of an example semiconductor device fabrication apparatus including a fluid dispenser according to embodiments.

FIG. 11 is a diagram illustrating a schematic configuration of an example semiconductor device fabrication apparatus 500 including the fluid dispenser 100 according to embodiments.

Referring to FIGS. 1 to 11, the semiconductor device fabrication apparatus 500 includes the fluid dispenser 100, and photoresist may be accommodated in the bottle 110 of the fluid dispenser 100. Nitrogen gas supplied from the outside of the fluid dispenser 100 may go through the fourth connector 166B, the second flow path F2, the second connector 166A, and the gas supply tube 106 of the fluid dispenser 100 in this stated order and be supplied into the bottle 110. The photoresist accommodated in the bottle 110 may go from the bottle 110 through the fluid dispensing tube 104, the first connector 164A, the first flow path F1, and the third connector 164B in this stated order and flow out of the fluid dispenser 100, by the pressure generated by the supplied nitrogen gas.

The photoresist flowing out of the fluid dispenser 100 may be supplied to a tank 506 through a fluid supply tube 504, transported from the tank 506 to a pump 508, and supplied to a buffer room 516 of a rotary manifold 512 of a slit nozzle 510 through a fluid supply tube 514.

A flow rate of the photoresist may be controlled by cut-off valves 532 and 534 respectively mounted to the fluid supply tubes 504 and 514. The pressure in the fluid supply tube 514 or the pressure in the slit nozzle 510 is measured by a pressure sensor 530, and the operation of the pump 508 is controlled by a pump controller 540, whereby the pressure in the fluid supply tube 514 or the pressure in the slit nozzle 510 may be maintained at an output setting value of the pressure sensor 530.

A nozzle main body 550 may include a slit-shaped ejection port 552 extending in a nozzle length direction.

A wafer W may be loaded onto a spin chuck 560 by a transport device external to the semiconductor device fabrication apparatus 500. After the wafer W is loaded onto the spin chuck 560, the height of the slit nozzle 510 may be adjusted by an elevator, and the slit nozzle 510 may be moved above the spin chuck 560 in a certain direction. When the ejection port 552 of the slit nozzle 510 reaches a certain position of the wafer W, the photoresist may be ejected from the slit nozzle 510, thereby forming a photoresist layer PR on the wafer W.

Although the schematic configuration of the example semiconductor device fabrication apparatus 500 including the fluid dispenser 100 according to embodiments has been described with reference to FIG. 11, embodiments are not limited thereto. The fluid dispenser 100 according to embodiments may be used in various semiconductor device fabrication apparatuses. For example, the fluid dispenser 100 according to embodiments may be applied to various process equipment, e.g., deposition equipment, coating equipment, etching equipment, ion implantation equipment, bonding equipment, and the like, which are required by semiconductor device fabrication processes.

By way of summation and review, when a fluid dispenser includes a bottle and a cap for closing the entrance of the bottle and has a structure, in which a tube for dispensing fluid in the bottle to the outside of the bottle extends through the cap, the tube may be physically damaged upon coupling the cap to or decoupling the cap from the bottle depending upon coupling manners of the cap and the bottle. Thus, since an equipment replacement cycle may be reduced, costs required for equipment maintenance may be increased, and product defects and environmental contamination may be caused during semiconductor device fabrication processes.

In addition, various fluids may be used in semiconductor device fabrication processes. When fluid dispensers having the same shape and configuration are used for the various fluids, various process defects may occur, e.g., incorrect application of unintended fluid onto a wafer, mixing of different fluids in a production line, etc.

In contrast, according to example embodiments, a fluid dispenser, which is used in semiconductor device fabrication processes, has a structure free from the concern of applying physical stress to a tube for dispensing fluid in a bottle to the outside of the bottle while a cap is coupled to or decoupled from the bottle. Further, the structure of the fluid dispenser prevents process defects from being caused by the incorrect supply of unintended fluid even when a plurality of different fluids are used in a same semiconductor device fabrication process.

That is, according to the fluid dispenser of the embodiments, a cap structure of a bottle includes contracting/expanding bellows, with a dispensing tube extending through the bottle and the contracting/expanding bellows. Accordingly, when the cap structure is coupled to or decoupled from a bottle, physical stress is applied to the bellows, rather than directly to the tube. As no physical stress is applied to the tube for dispensing fluid from the bottle to the outside of the bottle, while a cap is coupled to or decoupled from the bottle, a preventive maintenance (PM) cycle can be increased. Further, process defects can be prevented from being caused by the incorrect supply of unintended fluid when a plurality of different fluids are used in a same semiconductor device fabrication process due to different shapes of the top of the bellows with the corresponding seal thereon.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A fluid dispenser, comprising:
a bottle having an opening;
a fluid dispensing tube inside the bottle;
an inner cap including:
  a top surface having first and second openings separated from each other,
  a lower cylindrical post extending from the top surface and being coupleable to the opening of the bottle, and
  an upper cylindrical post extending from the top surface and in an opposite direction relative to the lower cylindrical post; and
a cap connector detachably coupled to the upper cylindrical post, the cap connector expanding and contracting between an expansion position and a contraction position and providing an extension path of the fluid dispensing tube in the bottle,
wherein the cap connector includes:
  a cylindrical corrugated bellows, which defines an inner space providing the extension path of the fluid dispensing tube, and
  a recess top surface at a first end of the corrugated bellows, the recess top surface including a first intermediate opening at a position corresponding to the first opening of the top surface of the inner cap, and a second intermediate opening at a position corresponding to the second opening of the top surface of the inner cap.

2. The fluid dispenser as claimed in claim 1, wherein the cap connector further includes:
a bellows coupling portion, which extends from a second end of the corrugated bellows and is coupleable to the upper cylindrical post of the inner cap.

3. The fluid dispenser as claimed in claim 2, wherein the cap connector further includes a coil spring in the inner space, the coil spring being surrounded by the corrugated bellows.

4. The fluid dispenser as claimed in claim 1, further comprising an outer cap, which is clamp-coupleable to a portion of the inner cap, the cap connector being between the outer cap and the inner cap.

5. The fluid dispenser as claimed in claim 1, wherein the cap connector includes a contractible bellows, the fluid dispensing tube extending from the bottle to a top of the bellows.

6. The fluid dispenser as claimed in claim 1, wherein the fluid dispensing tube is extending from the bottle through the inner cap and through the cap connector.

7. The fluid dispenser as claimed in claim 6, wherein the cap connector includes a contractible bellows, the fluid dispensing tube extending from the bottle to a top of the bellows.

8. The fluid dispenser as claimed in claim 7, wherein the fluid dispensing tube extends from the bottle through the first opening and through the first intermediate opening, and an inert gas tube extends from a top of the bottle through the second opening and through the second intermediate opening.

9. The fluid dispenser as claimed in claim 6, further comprising an outer cap detachably coupled to a bottom edge of the lower cylindrical post of the inner cap, the cap connector being contracted between the outer cap and the inner cap when the outer and inner caps are coupled to each other.

10. A fluid dispenser, comprising:
a bottle with an opening, the opening including a first screw portion;
a fluid dispensing tube extending from the outside of the bottle to the inside of the bottle through;
an inner cap including:
  a top surface having first, second, and third openings separated from each other, the fluid dispensing tube extending into the bottle through the first opening,
  a lower cylindrical post vertically extending from an edge of the top surface in a first direction, the lower cylindrical post having an inner wall that includes a second screw portion fastenable to the first screw portion, and
  an upper cylindrical post protruding from the top surface in a second direction opposite to the first direction, the upper cylindrical post having a diameter that is less than a diameter of the top surface, and
a cap connector detachably coupled to the upper cylindrical post, the cap connector expanding and contracting between an expansion position and a contraction position along the first direction and the second direction and providing an extension path of the fluid dispensing tube; and
an outer cap coupleable to a portion of the inner cap while pressing the cap connector such that the cap connector is maintained at the contraction position,
wherein the cap connector includes:
  a cylindrical corrugated bellows, which defines an inner space providing the extension path of the fluid dispensing tube, and
  a recess top surface recessed from a first end of the corrugated bellows and extending parallel to the top surface of the inner cap, the recess top surface including a first intermediate opening at a position corresponding to the first opening and a second intermediate opening at a position corresponding to the second opening.

11. The fluid dispenser as claimed in claim 10, wherein the upper cylindrical post has an outer sidewall including a third screw portion, and the cap connector has an inner sidewall including a fourth screw portion fastenable to the third screw portion.

12. The fluid dispenser as claimed in claim 10, wherein the first opening and the second opening are surrounded by the upper cylindrical post, and the third opening is outside the upper cylindrical post.

13. The fluid dispenser as claimed in claim 10, wherein the cap connector further includes:
   a bellows coupling portion, which extends from a second end of the corrugated bellows and is coupleable to the upper cylindrical post; and
   a coil spring in the inner space, the coil spring being surrounded by the corrugated bellows.

14. The fluid dispenser as claimed in claim 13, wherein the outer cap includes:
   a sealing insertion unit insertable into a sealing space defined by the recess top surface;
   a sealing cover, which is coupled to the sealing insertion unit, surrounding the corrugated bellows to seal the cap connector when the sealing insertion unit is inserted into the sealing space; and
   a fixing cover coupled to the sealing cover and having a plurality of clamp arms coupleable to the inner cap.

15. The fluid dispenser as claimed in claim 14, wherein an end of each of the plurality of clamp arms includes a clamp coupleable to an end of the lower cylindrical post of the inner cap.

16. The fluid dispenser as claimed in claim 14, further comprising a fixture penetrating and fixing the sealing insertion unit, the sealing cover, and the fixing cover in this stated order.

17. The fluid dispenser as claimed in claim 14, wherein:
   the recess top surface includes a circular recess and at least one protruding recess, which communicates with the circular recess and protrudes out of the circular recess, the recess top surface having a first planar shape obtained by the combination of the circular recess and the at least one protruding recess,
   the sealing insertion unit includes a circular insertion portion having a shape corresponding to the circular recess and at least one protruding insertion portion, which is integrally coupled to the circular insertion portion and has a shape corresponding to the at least one protruding recess, the sealing insertion unit having a second planar shape obtained by the combination of the circular insertion portion and the at least one protruding insertion portion, and
   when the sealing insertion unit is inserted into the sealing space defined by the recess top surface, the at least one protruding insertion portion is inserted into the at least one protruding recess.

18. The fluid dispenser as claimed in claim 14, further comprising an O-ring between the cap connector and the sealing cover, the O-ring sealing the sealing space.

19. The fluid dispenser as claimed in claim 10, wherein:
   the outer cap includes a first flow path and a second flow path, which extend in the first direction through the outer cap,
   a first end of each of the first flow path and the second flow path is exposed outside of the outer cap, and
   a second end of each of the first flow path and the second flow path is open inside of the outer cap.

20. The fluid dispenser as claimed in claim 19, further comprising a plurality of connectors, each connector connected to first one end of each of the first flow path and the second flow path.

* * * * *